United States Patent [19]

Mori et al.

[11] 4,409,682
[45] Oct. 11, 1983

[54] DIGITAL EDITING SYSTEM FOR AUDIO PROGRAMS

[75] Inventors: Toshinori Mori; Yoshiyuki Tsuchikane; Takashi Matsushige, all of Yokohama, Japan

[73] Assignee: Victor Company of Japan, Limited, Yokohama, Japan

[21] Appl. No.: 188,273

[22] Filed: Sep. 18, 1980

[30] Foreign Application Priority Data

Sep. 18, 1979 [JP] Japan ................................ 54-119616

[51] Int. Cl.³ .......................... G09B 5/04; G06F 3/16; G06F 5/00
[52] U.S. Cl. ......................................... 369/3; 84/1.22; 84/1.27; 369/83; 364/900; 381/51; 381/104
[58] Field of Search ............ 179/1 VL, 1 SM, 1 VC, 179/15.55 R, 18 BC; 84/1.22, 1.01; 369/3, 47, 49, 83, 50, 60; 340/146.3 WD; 364/200, 900

[56] References Cited

U.S. PATENT DOCUMENTS

| | | | |
|---|---|---|---|
| 3,659,059 | 4/1972 | Ivy ............................................ | 369/3 |
| 3,803,358 | 4/1974 | Schirf et al. ...................... | 179/1 SM |
| 3,984,643 | 10/1976 | Inrig et al. ...................... | 179/18 BC |
| 4,059,735 | 11/1977 | Betts ................................ | 179/18 BC |
| 4,092,495 | 5/1978 | Underwood et al. ............ | 179/1 SM |
| 4,119,807 | 10/1978 | Nahay ............................ | 179/18 BC |
| 4,203,005 | 5/1980 | Fokuda et al. .................. | 179/18 BC |
| 4,215,247 | 7/1980 | Lambert ........................ | 179/18 BC |
| 4,244,257 | 6/1981 | Niimi et al. ................... | 84/1.22 |
| 4,306,114 | 12/1981 | Callahn ........................ | 369/3 X |
| 4,311,369 | 1/1982 | Kohtani ........................ | 369/3 X |
| 4,319,084 | 3/1982 | Lucchini et al. ............... | 179/1 SM |
| 4,323,732 | 4/1982 | Wiggins et al. ................ | 179/1 SM |

Primary Examiner—Mark E. Nusbaum
Assistant Examiner—William G. Niessen
Attorney, Agent, or Firm—Lowe, King, Price & Becker

[57] ABSTRACT

A digital editing system includes first and second memories in which audio data and weighting factor data are respectively stored. The audio data are sequentially retrieved from the first memory and multiplied by corresponding weighting factor data retrieved from the second memory. A coincidence detector detects when predetermined storage locations of the memories are addressed. The weighting factor data has a unity or zero value during the time prior to the occurrence of an output from the detector, whereupon it changes its value as a function of time until it reaches to zero or unity and remains at the final value thereafter. The direction of variation of the weighting factor data can be appropriately selected to modify the audio data into a so-called "fade out" of "fade-in" pattern at a desired point of the audio program. A pair of such editing systems is required for editing audio programs from different sources for storing such programs in a pair of first memories. Weighting factor data respectively stored in the second memories vary in opposite directions so that the audio data from the first memories are modified into "fade-out" and "fade-in" patterns which are combined in an adder to create a single, continuous audio program.

6 Claims, 5 Drawing Figures

DIGITAL EDITING SYSTEM FOR AUDIO PROGRAMS

BACKGROUND OF THE INVENTION

The present invention relates generally to a system for editing prerecorded materials such as music programs from separate sources into a single, continuous program, and particularly to such systems employing digital techniques to facilitate locating a desired program point.

Editing prerecorded music programs is a tedius and time consuming affair because it involves accurately locating pertinent portions of materials to be joined together so that there is no appreciable discontinuity in a recording medium into which the combined programs are transcribed.

SUMMARY OF THE INVENTION

According to a first aspect of the present invention an analog music signal is quantized into a train of data words which are stored in a first memory. Weighting factor data words are stored in a second memory in locations corresponding to the data words stored in the first memory. The first and second memories are addressed to sequentially retrieve the corresponding audio data words and weighting factor data words. The audio data words are successively multiplied by the corresponding weighting factor data words so that the multiplied output data has a change in magnitude at a program point which can be easily determined by appropriately selecting desired storage locations of the first and second memories.

According to a second aspect of the invention, analog music program signals from separate sources are quantized into respective trains of data words which are stored respectively in first and second random access memories. First and second sets of weighting factor data words are respectively stored in first and second read-only memories in locations corresponding to the data words stored in the first and second random access memories, respectively. The weighting factor data words stored in the first read-only memory decrease in value as a function of time within a range from unity to zero, while the weighting factor data words stored in the second read-only memory increase in value as a function of time within a range from zero to unity. The random access memories and read-only memories are addressed to sequentially retrieve the corresponding data words. Those retrieved from the first random access memory are multiplied by the weighting factor data words retrieved from the first read-only memory so that the multiplied digital output decreases at a preselected point from the instantaneous value of the original audio signal to zero level, or "fades out", and those retrieved from the second random access memory are multiplied by the weighting factor data words retrieved from the second read-only memory so that the multiplied digital output increases at the preselected point from zero level to the instantaneous value of the original audio signal, or "fades in". The fading-out and fading-in digital outputs are combined together to produce a single, continuous output which may be transcribed into a recording medium.

BRIEF DESCRIPTION OF THE DRAWINGS

The present invention will be further described by way of example with reference to the accompanying drawings, in which.

DETAILED DESCRIPTION

Figure 1:
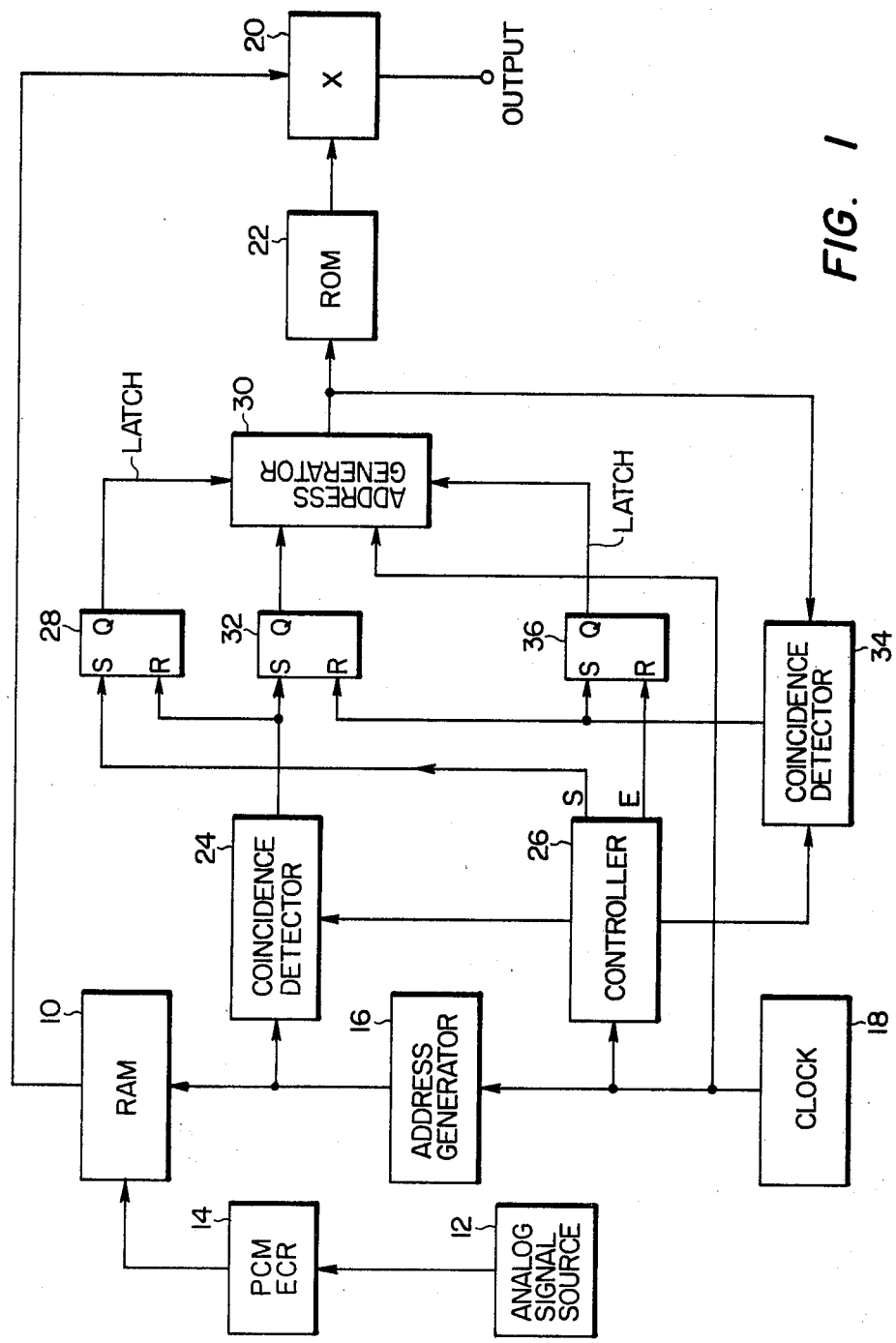
FIG. 1 is an illustration of a schematic block diagram of a first embodiment of the present invention.

Referring now to FIG. 1, there is illustrated a first embodiment of the present invention which is useful for locating a desired portion of a prerecorded audio program and modifying the located portion of the program according to a predetermined pattern. The embodiment comprises a random access memory 10 in which is stored a digital audio signal composed of data words representing sampled values of analog audio signal. These data words are derived from an analog signal source 12 which feeds its output to a known PCM encoder 14 which samples the analog signal at a predetermined frequency and quantizes the sampled value into a binary coded word. The data words are sequentially stored in a suitable manner well known in the art and retrieved by address data provided by an address generator 16 which is usually a binary counter responsive to clock pulses supplied from a clock source 18 for successively changing the addressed storage locations. The successively retrieved audio data words are applied to one input of a digital multiplier 20 where the input word is multiplied by another digital word supplied to another input thereof from a read-only memory 22. The ROM 22 stores data words representing weighting factors or multiplying factors which vary in magnitude within a range between zero and unity as a function of time as illustrated in FIG. 2.

The output of the address generator 16 is also applied to one input of a coincidence detector 24 for detecting a correspondence with an address data supplied to its other input from a controller 26. The controller 26 receives the clock pulse to provide a start signal on terminal "S" to the set input of a flip-flop 28 generating a logical one from its Q output to an address generator 30 which is in receipt of the clock pulse. The address generator 30 is latched in response to this output from the flip-flop 28 to an appropriate address data which is repeatedly supplied to the ROM 22 in response to each of the clock pulses so that the ROM 22 generates repeatedly a binary equivalent of decimal "1" as a weighting factor. This latched condition continues until the flip-flop 28 is reset by an output from the coincidence detector 24. Simultaneously, a flip-flop 32 is triggered by the coincidence detector 24 to enable the address generator 30 to start generating successively changing address data in response to each clock pulse. The variable weighting factor data in the ROM 22 are successively retrieved until the binary equivalent of decimal "0" is reached in the ROM 22. This condition is detected by a second coincidence detector 34 by comparison between the output of the address generator 30 and corresponding data supplied from the controller 26. The coincidence detector 34 output is supplied to the reset terminal of the flip-flop 32 and also to the set terminal of a flip-flop 36 to latch the address generator 30 again, whereby the binary weighting factor "0" is repeatedly retrieved from the ROM 22.

It is appreciated that by appropriately selecting the digital value of an address data given by the controller 26 a portion of the digital audio signal is modified in amplitude at a desired point onward until it reaches zero level. The flip-flop 36 will be reset by a terminating signal which appears on terminal "E" of the controller 26 when the count value of clock pulses reaches a preset value.

Figure 2:
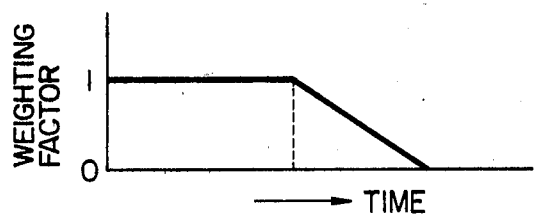
FIG. 2 is an illustration of weighting factor data as a function of time.

The weighting factor data words stored in the ROM 22 may be modified so that it sharply drops to zero at a specified point as indicated by a broken line in FIG. 2. In this case the digital audio signal is sharply cut off at an appropriately controlled point of the audio program.

Figure 3:
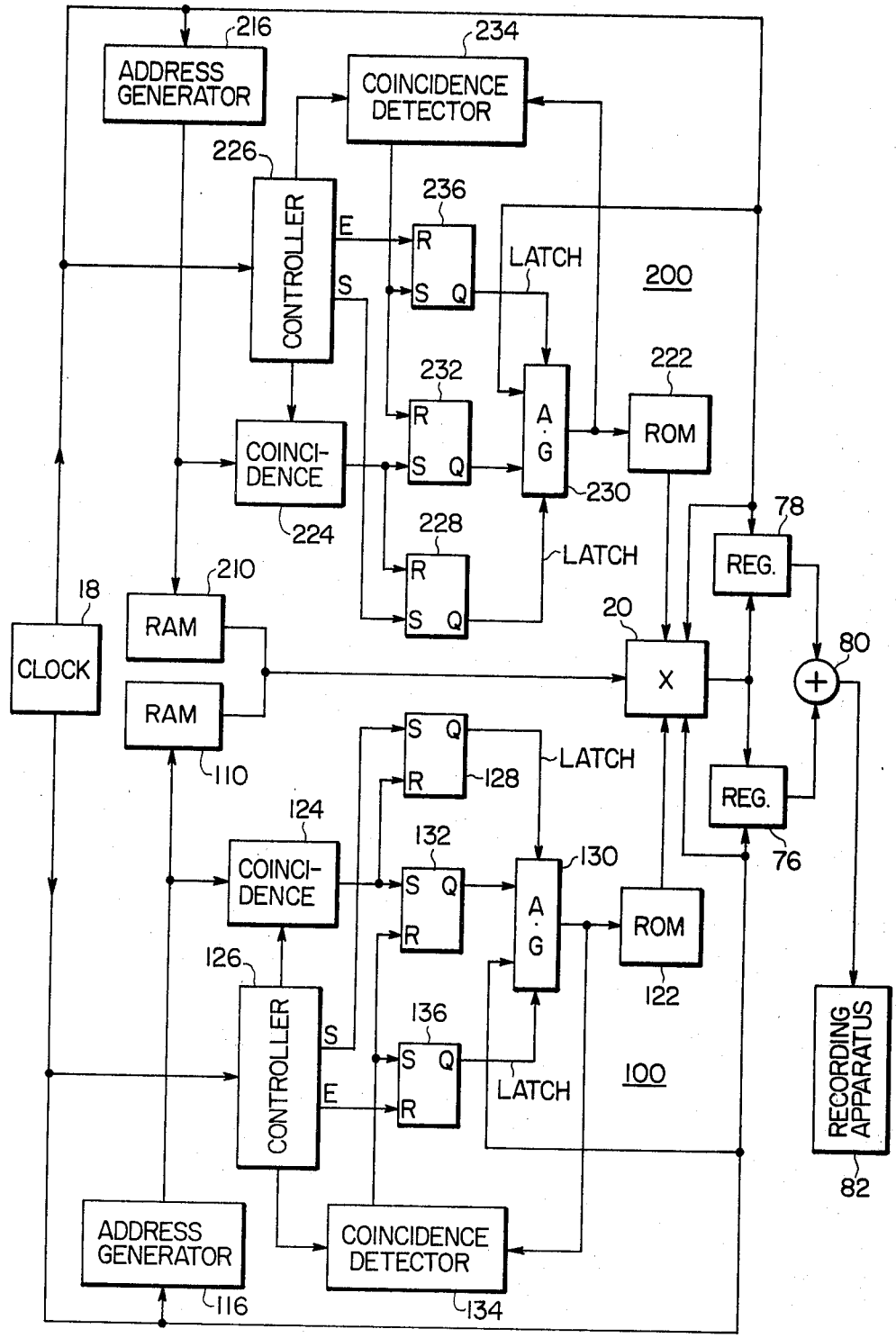
FIG. 3 is an illustration of a second embodiment of the present invention.

A second embodiment of the present invention is illustrated in FIG. 3. This embodiment is used for editing audio signals from two separate analog sources to create a single audio program with a smooth transition at an appropriate editing point. Before going into the details of the second embodiment, reference is made to the underlying principle with reference to FIG. 4.

When editing two analog audio signals which are recorded in respective magnetic tapes, for example, these analog signals are converted into PCM signals and recorded in respective random access memories as described in connection with the first embodiment. The PCM signal derived from the first audio source comprises a train of data words which are described by $W_{A0}, W_{A1} \ldots W_{Am}$ for convenience. Likewise, the PCM signal derived from the second audio source is described by a train of data words $W_{B0}, W_{B1} \ldots W_{Bn}$. These random access memories are alternately addressed to retrieve a preselected number "l" of data words $W_{Ai}, W_{A(i+1)} \ldots W_{A(i-1+l)}$ and $W_{Bj}, W_{B(j+1)} \ldots W_{B(j-1+l)}$, (where i ranges from zero to m, and j ranges from zero to n) from the storage fields of the memories including a data point at which two analog signals are to be joined or "edited". The retrieved data words of the data group $W_A$ are successively multiplied by an associated weighing factor data $a_K$ (where K ranges from unity to "l"). The weighting factor $a_K$ varies as a function of time from unity when K=1 to zero when K=l so that the train of the multiplied or weighted data words tapers in amplitude as a function of time or "fades out". On the other hand, the retrieved data words of the group $W_B$ are multiplied by an associated weighting factor $b_K$ which varies from zero when K=1 to unity when K=l so that the train of the weighted data words tapers in amplitude in a direction opposite to the direction of taper of the data words $W_A$, or "fades in".

The weighted data of the groups $W_A$ and $W_B$ are temporarily stored in respective registers and then combined together to generate an output data which is described as follows:

$$W_{CK} = a_K \cdot W_{A(i-1+K)} + b_K \cdot W_{B(j-1+K)} \quad (1)$$

and where $a_K$ and $b_K$ have the following relation:

$$b_K 1 - a_K \quad (2)$$

Since the data train described by Equation (1) has been derived from the storage fields corresponding to the tapered or "fading" portion of the analog signals which are to be edited, the full length of the combined output data can be described from Equation (1) as follows:

$$W_{CK} = a_K \cdot W_{AK} + b_K \cdot W_{B(K-i+j)} \quad (3)$$

where $a_K$ and $b_K$ are determined as a function of the K value as follows:

(a) $a_K=1$, $b_K=0$, if K ranges from zero to (i−1);
(b) $a_K$ varies from unity to zero, while $b_K$ varies from zero to unity as K varies from "i" to (i−1+l); and
(c) $a_K=0$, $b_K=1$, if the K value exceeds (i+l).

Figure 4:
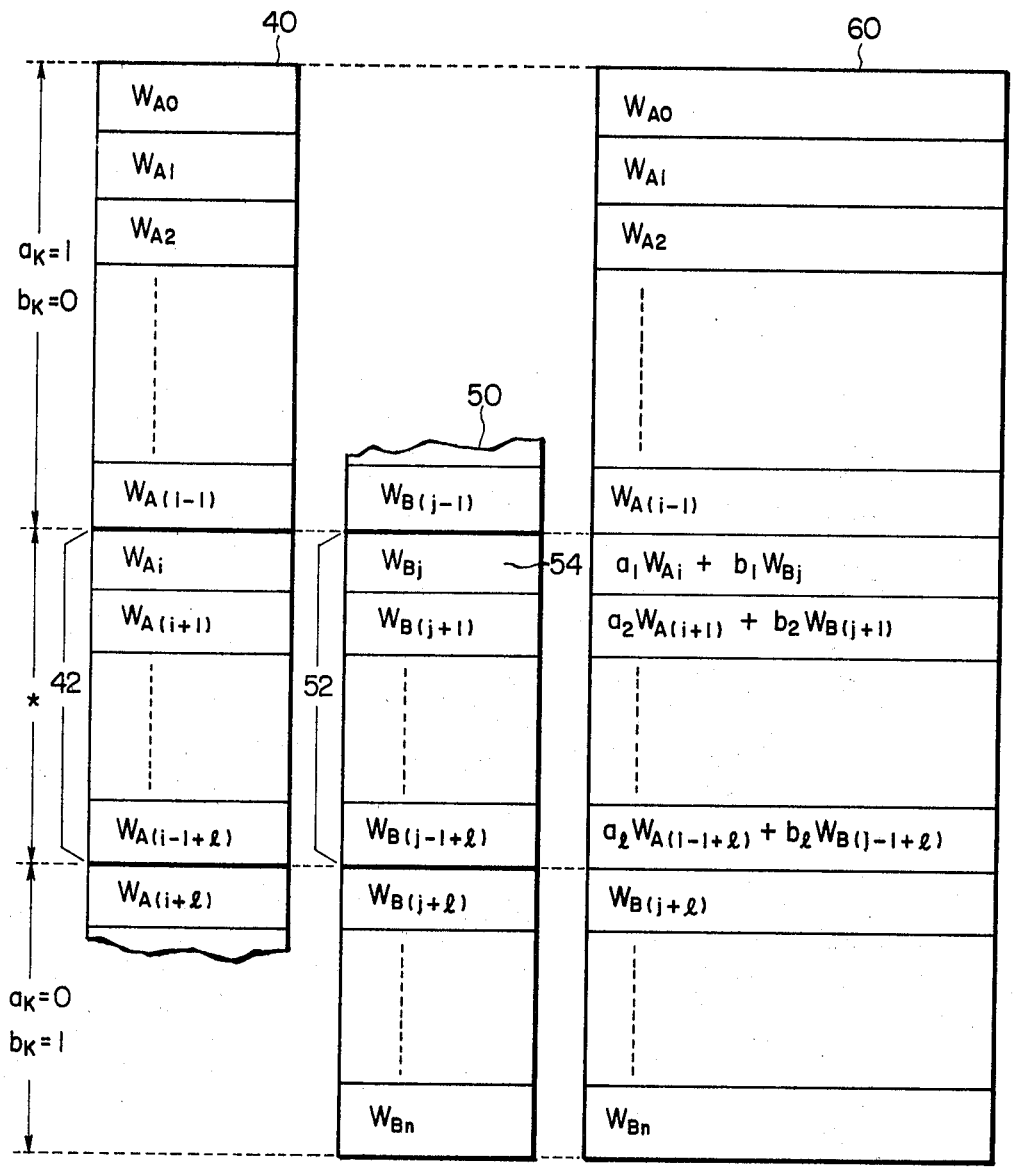
FIG. 4 is an illustration useful for describing the arrangement of data words stored in respective random access memories in relation to the arrangement of the combined output data words.

In FIG. 4, the data trains $W_A$ and $W_B$ are shown arranged in storage fields 40 and 50, respectively, with the fading portion of the two data trains being shown in data fields 42 and 52, respectively. The combined or edited data trains are arranged in a storage field 60.

Returning to FIG. 3, the second embodiment of the invention comprises a pair of generally identical sections 100 and 200 each being of generally identical construction to that of the first embodiment with corresponding parts being identified with numbers corresponding to those of FIG. 1 preceded by the associated section numbers. The clock source 18 generates the timing signals at alternate intervals for timing the separate sections 100 and 200 to operate the common multiplier 20 on a time sharing basis. In this embodiment, the data words $W_{A0}$ to $W_{Am}$ are placed in storage in the RAM 110 and the data words $W_{B0}$ to $W_{Bn}$ in the ROM 210. The weighting factor data words $a_K$ and $b_K$ are stored respectively in the ROMs 122 and 222.

The operation of the system is initiated in the controllers 126 and 226 when they activate their respective starting terminals "S" to trigger flip-flops 128 and 228 in response to receipt of their first clock pulses from the clock source 18. This causes the address generators 130 and 230 to switch to a latched mode. The address generator 130 begins addressing a specified location of the ROM 122 where the weighting factor data $a_K=1$ is stored, while the address generator 230 starts addressing a location of the ROM 222 where the weighting factor data $b_K=0$ is stored. At the same time, the address generators 116 and 216 start addressing the RAMs 110 and 210, respectively, to alternately retrieve the data words $W_A$ and $W_B$ and transmit them to the digital multiplier 20. During the time prior to the detection of a coincidence in the coincidence detectors 124 and 224, the data words $W_{A0}$ to $W_{A(i-1)}$ are retrieved from the RAM 110 and multiplied by the weighting factor $a_K=1$, while the data words $W_{B0}$ to $W_{B(j-1)}$ are retrieved from the RAM 210 and multiplied by the weighting factor $b_K=0$. Therefore, the data train $W_A$ unergoes no changes in amplitude and the data train $W_B$ is completely nullified.

Upon the detection of the coincidence in the respective detectors 124 and 224, the flip-flops 132 and 232 are triggered to enable the address generators 130 and 230 to start varying this address data. The weighting factor data $a_K$ retrieved from ROM 122 changes its value within a range from unity to zero as described above, and the weighting factor data $b_K$ retrieved from ROM 222 changes its value in a direction opposite to the direction of variation of the data $a_K$. Therefore, the data words $W_{Ai}$ to $W_{A(i-1+l)}$ are multiplied by the decreasing values of weighting factor $a_K$ and the data words $W_{Bj}$ to $W_{B(j-1+l)}$ are multiplied by the increasing values of weighting factor $b_K$.

When the address data associated with the data words $W_{A(i+l)}$ and $W_{B(j+l)}$ are respectively detected by the coincidence detectors 134 and 234, the address generators 130 and 230 are latched again respectively by the flip-flops 136 and 236 to repeatedly generate the address data for retrieving the weighting factors $a_k=0$ and $b_K=1$ from respective ROMs 122 and 222. Thus, the data words $W_{A(i+l)}$ to $W_{Am}$ are multiplied by zero and the data words $W_{B(j+l)}$ to $W_{Bn}$ are multiplied by unity. As a result, the data trains $W_A$ and $W_B$ are modified into fade-out and fade-in patterns, respectively.

The multiplied data are respectively fed into registers 76 and 78 in response to alternately generated clock pulses and thence to an adder 80 to provide summation of the fade-out and fade-in data, so that the data words shown at 60 in FIG. 4 are derived from the adder 80 and applied to a suitable recording apparatus 82.

Figure 5:
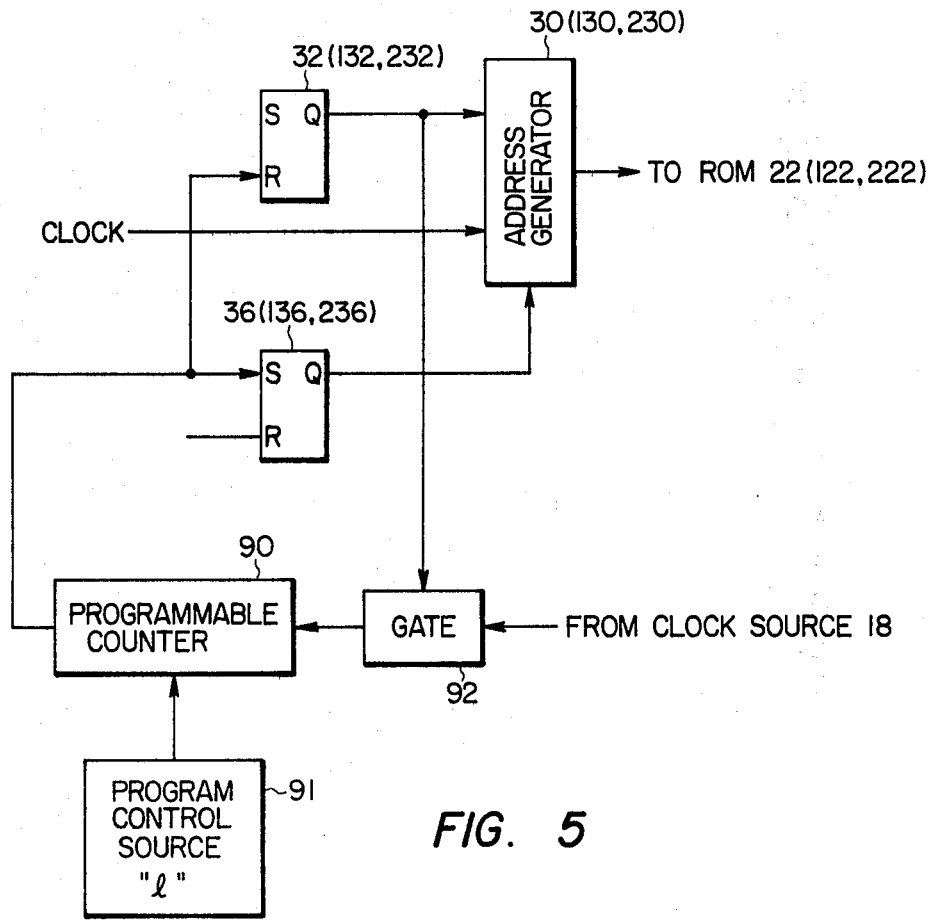
FIG. 5 is an illustration of a modification of the embodiments of FIGS. 1 and 3.

FIG. 5 is an illustration of a modification of the previous embodiments. In this modification, the coincidence detector 34 (134, 234) is replaced with a circuit including a programmable counter 90, a program control source 91 and a gate circuit 92 which transmits clock pulses to the counter 90 in the presence of a logical one output from the flip-flop 32. The program control source 91 establishes the program or preset count value "l" in binary form to cause the counter 90 generate its output when that preset value is reached. In response to the output of the counter 90 the flip-flops 32 and 36 are reset and set, respectively.

What is claimed is:

1. A digital editing system for combining first and second digitized analog signals into a third, continuous signal, comprising:
    first and second digital memories in which said first and second digitized analog signals are respectively stored;
    third and fourth digital memories in which first and second digital weighting factors are stored respectively, the first digital weighting factors representing a magnitude decreasing from unity to zero and stored in locations sequentially addressable as a function of time and the second digital weighting factors representing a magnitude increasing from zero to unity and stored in locations sequentially addressable as a function of time;
    first, second, third and fourth address generators respectively associated with said first, second, third and fourth memories;
    control means for initially causing said first and second address generators substantially simultaneously to retrieve the first and second digitized analog signals sequentially from sequential addresses generated thereby for said first and second digital memories and for subsequently causing said third and fourth address generators substantially simultaneously to retrieve the first and second digital weighting factors sequentially from said third and fourth digital memories when a predetermined address is reached by said first and second address generators;
    means for multiyplying the retrieved first and second digitized analog signals respectively by digital magnitudes of unity and zero until said predetermined address is reached, and for subsequently multiplying the retrieved first and second digitized analog signals first by the retrieved first and second digital weighting factors, respectively, and thereafter by digital magnitudes of zero and unity, respectively; and
    means for combining the multiplied first and second digitized analog signals to generate a combined digital signal.

2. A digital editing system as claimed in claim 1, wherein said control means comprises:
    first means for detecting a first match between the address generated by said first address generator and a first predetermined address and for enabling said third address generator for sequentially retrieving the first digital weighting factors from said third memory;
    second means for detecting a second match between the address generated by said third address generator and a second predetermined address and for causing said third address generator to latch the address contents therein;
    third means for detecting a third match between the address generated by said second address generator and said first predetermined address and for enabling said fourth address generator for sequentially retrieving the second digital weighting factors from said fourth memory; and
    fourth means for detecting a fourth match between the address generated by said fourth address generator and said second predetermined address for causing said fourth address generator to latch the address content therein.

3. A digital editing system as claimed in claim 1, wherein said first and second digital memories each comprise a random access memory.

4. A digital editing system as claimed in claim 1, wherein said third and fourth digital memories each comprise a read-only memory.

5. A digital editing system as claimed in claim 2, wherein said third and fourth memories each comprise storage locations in which digital magnitudes of unity and zero are stored, wherein said third address generator is arranged initially to retrieve the digital magnitude of unity from said third memory until the detection of said first match and subsequently to retrieve the first digital weighting factors sequentially therefrom until the detection of said second match and subsequently to retrieve the digital magnitude of zero therefrom, and wherein said fourth address generator is arranged initially to retrieve the digital magnitude of zero from said fourth memory until the detection of said third match and subsequently to retrieve the second digital weighting factors sequentially therefrom until the detection of said fourth match and subsequently to retrieve the digital magnitude of unity therefrom.

6. A digital editing system as claimed in claim 1, further comprising means for causing said first and third digital memories to operate on a time shared basis with said second and fourth digital memories.

* * * * *

UNITED STATES PATENT OFFICE
CERTIFICATE OF CORRECTION

Patent No. 4,409,682                Dated    October 11, 1983

Inventor(s) Toshinori Mori; Yoshiyuki Tsuchikane; and Takashi Matsushige

It is certified that error appears in the above-identified patent and that said Letters Patent are hereby corrected as shown below:

Cover page, Item [30], add the following line under "Foreign Application Priority Data":

--Sep. 21, 1979 [JP] Japan.................. 54-121772--

Signed and Sealed this

Fourteenth Day of February 1984

[SEAL]

Attest:

GERALD J. MOSSINGHOFF

Attesting Officer      Commissioner of Patents and Trademarks